(12) United States Patent
Demange et al.

(10) Patent No.: US 9,161,477 B2
(45) Date of Patent: Oct. 13, 2015

(54) HYDRAULIC DISTRIBUTOR

(71) Applicant: BULL SAS, Les Clayes-sous-Bois (FR)

(72) Inventors: Fabien Demange, Poissy (FR); Jean-Christophe Bonnin, Rambouillet (FR)

(73) Assignee: BULL SAS, Les Clayes-sous-Bois (FR)

( * ) Notice: Subject to any disclaimer, the term of this patent is extended or adjusted under 35 U.S.C. 154(b) by 0 days.

(21) Appl. No.: 14/189,758

(22) Filed: Feb. 25, 2014

(65) Prior Publication Data

US 2014/0238516 A1    Aug. 28, 2014

(30) Foreign Application Priority Data

Feb. 28, 2013   (FR) ..................... 13 51780

(51) Int. Cl.
*F16L 53/00* (2006.01)
*H05K 7/20* (2006.01)

(52) U.S. Cl.
CPC ........ *H05K 7/20218* (2013.01); *H05K 7/20781* (2013.01); *Y10T 137/87265* (2015.04)

(58) Field of Classification Search
CPC ............. H01L 23/473; H05K 7/20218; H05K 7/20781
USPC ................. 361/699, 702, 703, 721, 724, 728; 137/599.14, 614.02; 251/141.6, 149.6, 251/149.7
See application file for complete search history.

(56) References Cited

U.S. PATENT DOCUMENTS

| | | | | |
|---|---|---|---|---|
| 6,807,056 B2* | 10/2004 | Kondo et al. | ................. | 361/689 |
| 7,258,161 B2* | 8/2007 | Cosley et al. | ............ | 165/104.33 |
| 7,466,549 B2* | 12/2008 | Dorrich et al. | ................ | 361/699 |
| 7,614,247 B2* | 11/2009 | Nicolai et al. | ............... | 62/259.2 |
| 7,639,499 B1* | 12/2009 | Campbell et al. | ............. | 361/699 |
| 8,654,532 B2* | 2/2014 | Chen et al. | .................... | 361/701 |
| 8,824,147 B2* | 9/2014 | Caron et al. | .................. | 361/702 |
| 2004/0057211 A1 | 3/2004 | Kondo et al. | | |
| 2006/0243332 A1 | 11/2006 | Harvey et al. | | |
| 2009/0260777 A1 | 10/2009 | Attlesey | | |
| 2011/0026225 A1 | 2/2011 | Ostwald et al. | | |
| 2011/0240281 A1 | 10/2011 | Avery | | |
| 2011/0313576 A1* | 12/2011 | Nicewonger | .................. | 700/282 |
| 2013/0271917 A1* | 10/2013 | Steger et al. | .................. | 361/699 |

OTHER PUBLICATIONS

Search Report as issued for French Patent Application No. 1351780, dated Nov. 25, 2013.

* cited by examiner

*Primary Examiner* — John K Fristoe, Jr.
*Assistant Examiner* — Reinaldo Sanchez-Medina
(74) *Attorney, Agent, or Firm* — Pillsbury Winthrop Shaw Pittman LLP

(57) ABSTRACT

A hydraulic distributor capable of distributing a liquid coolant to a plurality of cooling devices, includes a liquid coolant inlet conduit into the hydraulic distributor; a plurality of supply conduits for the cooling devices by the liquid coolant, each of the supply conduits being hydraulically connected to the inlet conduit through a supply duct; a liquid coolant outlet conduit from the distributor; a plurality of liquid coolant return conduits in the distributor, each of the return conduits being hydraulically connected to the outlet conduit by a return duct; wherein at least one of the liquid coolant supply or return conduits can be fitted with a floating connector allowing for a hydraulic connection with at least one of the cooling devices among the plurality of cooling devices.

20 Claims, 4 Drawing Sheets

HYDRAULIC DISTRIBUTOR

CROSS REFERENCES TO RELATED APPLICATIONS

This application claims priority to French Patent Application No. 1351780, filed Feb. 28, 2013, the entire content of which is incorporated herein by reference in its entirety.

FIELD

The invention relates to a hydraulic distributor capable of distributing a liquid coolant to a plurality of cooling devices, particularly cooling devices for computer blades contained in a computer cabinet or in an element contained in a cabinet.

BACKGROUND

Computer servers are composed of processors, memories and other components that are placed on computer blades, themselves embedded in racks inside computer cabinets. A standard computer cabinet usually comprises several racks (or shelves) inside which one or several computer blades is or are embedded.

It is known that embedded computer blades can be cooled by means of an air cooling device. Thus, there are fans at the front of a rack containing computer blades, and air from the fans is forced onto heat sinks located on components of the computer blade that become hot. The hot air that exits from the back of the servers is managed by the air conditioning system in the room in which the server cabinets are located. Such a type of device installed for a 2 m high computer cabinet makes it possible to use cabinet with a maximum power to be dissipated equal to 20 kW, consequently limiting the calculation power of servers.

Another known server cooling device uses the air/water cooling principle. An air/water exchanger is placed at the back of the cabinets. Air passes through the servers, recovers heat dissipated from the servers as its passes and then goes through the air/water exchanger inside which cold water circulates. Cold water circulating in the exchanger is at a temperature of about 7° C. at the inlet for 40 kW and a room temperature of 26° C. As a result the water temperature at the outlet from the cabinet is equal to the air temperature that enters into the cabinet. Thus, for the customer's air conditioning, the cabinet is neutral in terms of air conditioning of the room. Such a system can increase the power that can be generated inside the cabinet up to a maximum of 40 kW that can be dissipated by the air/water cooling device. However, such a device requires a cold water inlet which is not optimum in terms of energy efficiency because it requires the presence of cooling units with compressors inside the room, and these cooling units are particularly energy intensive elements. Furthermore, such a device also limits the available power of such computer cabinets to about 40 kW, consequently limiting the potentially available computer power.

All-hydraulic cooling systems were developed later. This type of cooling system comprises a cold plate located above the components of a computer blade, this cold plate carrying a cooling circuit inside which a liquid coolant circulates. Such a device comprises at least one cold plate picking up heat emitted by computer blades located in the cabinet. The liquid coolant circulates inside each of the cold plates of the computer blades and is then transferred to a water/water exchanger common to the computer blades. Due to the large amount of heat released by the components of the computer blades, water at "ambient temperature" is sufficient to cool them, at the same temperature as the temperature in the room in which the computer server cabinets are located. Thus, there is no longer any need for cold water or hot air to be evacuated and cooled, which considerably reduces the costs of such an installation. However, this type of all-hydraulic cooling creates maintenance problems. The connection between the set of cold plates of computer blades, cooling devices and the water/water exchanger would be made in the bottom of the computer cabinet and manual access to the back of the computer cabinet would be necessary to disconnect the hydraulic connection means between the cold plates and the water/water exchanger, if the computer blades were to be removed/replaced. This constraint introduces other constraints, namely the need for space in the room containing the computer cabinets to allow access behind the computer cabinets and the loss of time associated with this action.

SUMMARY

For the purposes of this application, the liquid coolant inlet conduit in the distributor refers to a conduit that carries liquid coolant from outside the distributor to inside the distributor. This may be done by means of a supply pipe connecting the inlet conduit to a storage device outside the liquid coolant distributor.

For the purposes of this application, a supply conduit for the cooling devices using a liquid coolant refers to a conduit that carries the liquid coolant from the distributor to one of the cooling devices.

For the purposes of this application, a supply duct for this application refers to a duct internal to the distributor inside which the liquid coolant can circulate, the duct carrying the liquid coolant in circulation between the inlet conduit and the plurality of supply conduits.

For the purposes of this application, a liquid coolant outlet conduit from the distributor refers to a conduit that carries the liquid coolant outside the distributor once it has passed through the cooling devices. This outlet may be made through a pipe connecting the outlet conduit to the storage device outside the liquid coolant distributor, for example in which this liquid coolant can be cooled or evacuated.

For the purposes of this application, a liquid coolant return conduit into the distributor refers to a conduit that carries the liquid coolant from one of the cooling devices to the distributor.

For the purposes of this application, a return duct refers to a duct internal to the distributor inside which the liquid coolant can circulate, the duct carrying the liquid coolant in circulation between a plurality of return conduits and the outlet conduit.

An aspect of the invention aims to overcome the disadvantages of the state of the art identified above, and particularly to propose a compact arrangement for distributing a liquid coolant flow on the computer blades of a computer cabinet rack, in order to guarantee precise insertion of computer blades in the rack.

To achieve this, one aspect of the invention relates to a hydraulic distributor capable of distributing a liquid coolant to a plurality of cooling devices, the distributor comprising:
  a liquid coolant inlet conduit into the distributor;
  a plurality of supply conduits for the cooling devices by the liquid coolant, each of the supply conduits being hydraulically connected to the inlet conduit through a supply duct;
  a liquid coolant outlet conduit from the distributor;

a plurality of liquid coolant return conduits in the distributor, each of the return conduits being hydraulically connected to the outlet conduit by means of a return duct;
in which at least one of the liquid coolant supply or return conduits can be fitted with a floating connector allowing for a hydraulic connection with at least one of the cooling devices among the plurality of cooling devices.

The floating connector can set up a hydraulic connection between the supply conduit or the return conduit and one of the cooling devices.

Thus, the hydraulic distributor according to an embodiment of the invention may easily be located in the rack at the backpanel board, and create the connection between the hydraulic connectors located on the backpanel board and computer blade cooling devices, for example cold plates, so as to distribute the liquid coolant at the inlet into the distributor between the different cooling devices. Power connectors and analogue/digital electrical connectors are fitted very precisely on the backpanel board and the distributor is positioned very precisely relative to this backpanel board so that the computer blades can be precisely inserted into the hydraulic distributor and also into the electrical and power connectors of the backpanel board. The use of floating connectors gives the necessary degree of freedom for a blind connection of computer blades to the hydraulic distributor integrated into the rack, while providing a suitable connection of computer server blades to the electronic and power connectors of the back panel board. The dimensions of the supply conduit or the return conduit adapted to hold a floating connector are larger than the dimensions of the floating connector. The computer blades are inserted in the rack and are connected to both the power and electrical connectors and to the hydraulic connectors of the hydraulic distributor. Precise positioning of the hydraulic distributor for example inside the rack makes it possible to connect and disconnect computer blades blind, without any additional action on the part of the user.

The liquid coolant flow at the inlet to the inlet conduit is distributed on the different computer blades by means of the plurality of supply conduits.

A cooling device will be connected both to a distributor supply conduit and to at least one return conduit from the distributor, so that the cooling device can be supplied with liquid coolant.

Apart from the main characteristics that have been mentioned in the above paragraph, the device according to an embodiment of the invention may have one of several complementary characteristics among the following characteristics, considered individually or in any technically possible combination:
  there is a mechanical clearance between a first axis of at least one of the liquid coolant supply or return conduits and a second axis of the floating connector. The floating connectors that will be inserted in the supply/return conduits have some freedom of movement due to the available mechanical clearance, the supply/return conduits being larger than the expected size of the floating connectors to allow this floating freedom of movement. The supply/return conduits and the floating connectors are cylindrical elements and therefore the axes of the elements refer to their axis of revolution. There is thus some clearance between the first axis of revolution of the supply/return conduit and the second axis of revolution of the floating connector. The flotation of the connector is assured by maintaining pressure that assures perfect tightness through control over the compression of a seal of the connector, for example an O-ring;
  it includes a device for keeping the floating connector under pressure on the liquid coolant supply and return conduits. For example, the pressure may be maintained by means of a plate located on one face of the hydraulic distributor, the face on which there is a plurality of supply and return conduits. The plate comprises one opening for each supply and return conduit, and therefore one opening for each floating connector. The floating connectors pass through the openings so as to fit into the distributor supply and return conduits in order to make the hydraulic connection of the cooling devices to the hydraulic distributor;
  it comprises an attachment device for the mechanical contact retaining device. The attachment device for the mechanical contact retaining device may be screws passing through openings formed in the retaining device such that tightening the screws holds the retaining device in mechanical contact, for example a plate in contact with a face of the hydraulic distributor on which there is at least one conduit into which a floating connector can fit;
  the liquid coolant supply duct and the liquid coolant return duct are arranged relative to each other such that the supply of liquid coolant to devices follows a last in/first out (LIFO) type system. This type of supply system with coolant fluid enables a balanced distribution of the liquid coolant flow between the different cooling devices to be supplied by the liquid coolant using the distributor;
  the supply duct and the return duct pass through the distributor horizontally, in that the inlet conduit and the return conduit are located at the same end of the distributor and in that the supply duct comprises a baffle. The baffle on the supply conduit enables a supply using the last in/first out type system of the devices when the inlet and return conduits are located at the same end of the hydraulic distributor;
  the supply duct and the return duct pass though the distributor horizontally, in that the distributor comprises a first end and a second end, the inlet conduit being located at a first end of the distributor and the outlet conduit being located at a second end of the distributor;
  the plurality of supply conduits and the plurality of return conduits of the liquid coolant are arranged on a first face of the hydraulic distributor;
  a first part of the plurality of supply conduits and the plurality of return conduits of the liquid coolant are arranged on a second face of the hydraulic distributor, and a second part of the plurality of supply conduits and the plurality of return conduits of the liquid coolant are arranged on a third face of the hydraulic distributor;
  the supply conduits and the return conduits on a same face of the distributor have different diameters. This enables a balanced distribution of the liquid coolant between the devices when these cooling devices are arranged facing the hydraulic distributor; and
  it is composed of two bodies, a first body comprising the liquid coolant inlet conduit, the plurality of liquid coolant supply conduits of the devices and the supply duct and a second body comprising the liquid coolant outlet conduit from the distributor, the plurality of liquid coolant return conduits and the return duct.

An aspect of the invention also relates to a computer cabinet rack comprising a hydraulic distributor according to one of the previously described embodiments.

BRIEF DESCRIPTION OF FIGURES

Other characteristics and benefits of the invention will become clear after reading the following description with reference to the appended figures that show.

Identical and similar elements are identified by the same references in all figures, to improve clarity.

DETAILED DESCRIPTION

Figure 1:
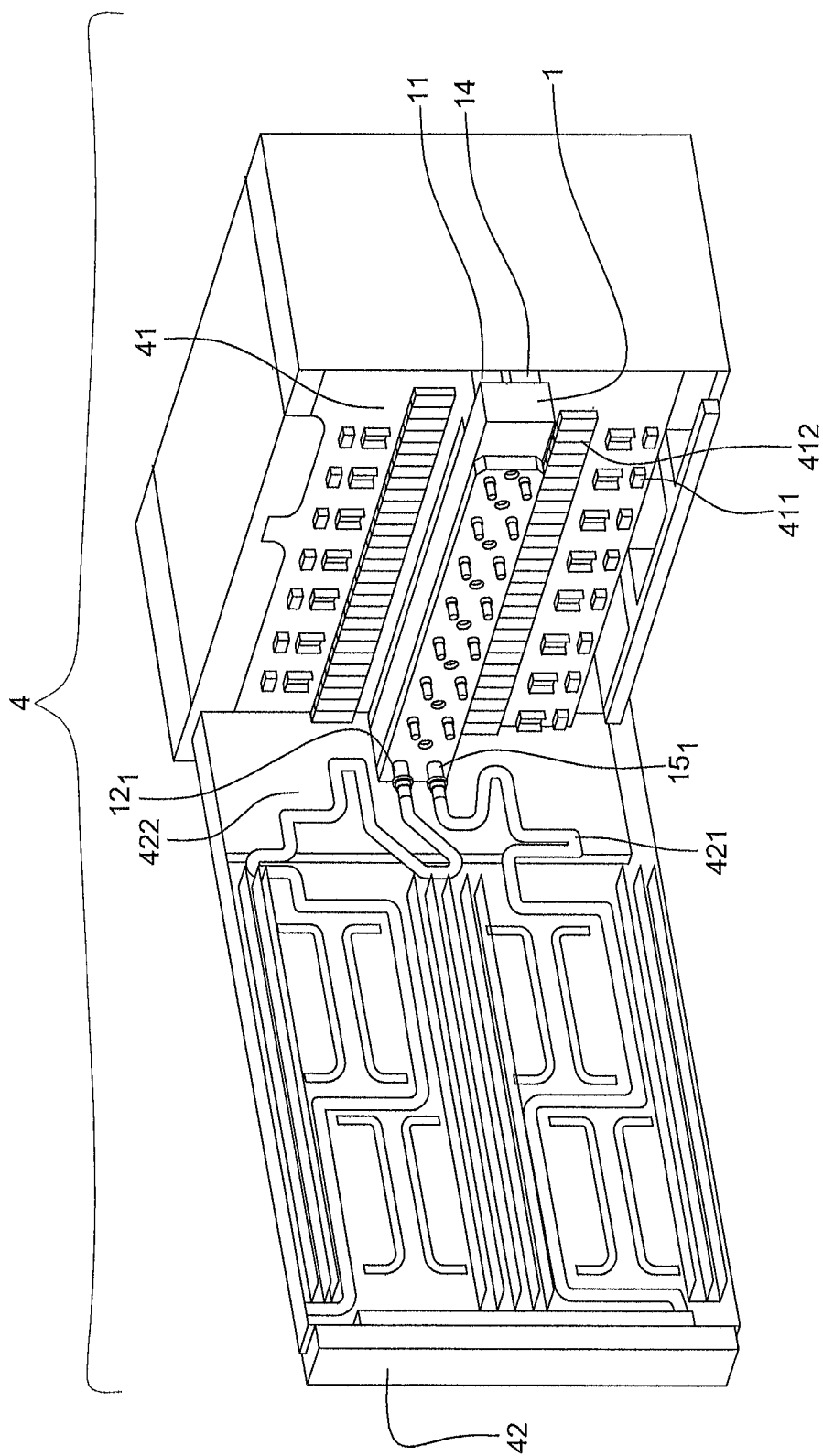
FIG. 1, an inside view of a rack of a computer cabinet according to an embodiment of the invention.

FIG. 1 shows the inside 4 of a rack or a rackable server that can be fitted on a rack. This rack can be removed from a frame forming the computer cabinet (not shown in FIG. 1). The rack comprises a backpanel board 41 perpendicular to a computer blade 42. The rack may comprise several computer blades, but for reasons of clarity a single computer blade is shown in FIG. 1. The computer blade 42 comprises an aluminium cold plate 422. The cold plate 422 comprises a hydraulic network 421 inside which a liquid coolant circulates so as to directly cool the components located on the computer blade. This hydraulic network 421 forms a cooling device R1 connected to a hydraulic distributor 1 by means of a supply conduit $12_1$ and a return conduit $15_1$. The liquid coolant enters the hydraulic distributor 1 through an inlet conduit 11 and exits from it through an outlet conduit 14. The hydraulic distributor 1 is fixed to the backpanel board.

The backpanel board 41 comprises power connectors 411 and electrical connectors 412 to interconnect the computer blades to each other and to connect them to a network connected to the computer cabinet containing the rack. The hydraulic distributor 1 is also fixed to the backpanel board 41, and is thus directly integrated into the core of the rack. This makes it easy to install and remove computer blades in the rack without needing to take action on the hydraulic distributor 1. It is desirable to minimise the dimensions of the distributor so that it could be integrated directly into the core of the rack, without occupying too much space in comparison with the computer blades and therefore without reducing the potential calculation power of the server. It is also desirable to include hydraulic connectors with no liquid leak at disconnection and without any air inlet at the connection and vice versa, to be able to connect and disconnect computer blades to the hydraulic distributor without leaks.

It is desirable to connect server blades rather than computer blades and it is desirable that the distributor is pre-filled and under pressure, from the point of view of operation of the hydraulic distributor in a rack of a computer cabinet.

The hydraulic distributor 1 will now be described in more detail with reference to FIGS. 2 to 4.

Figure 2:
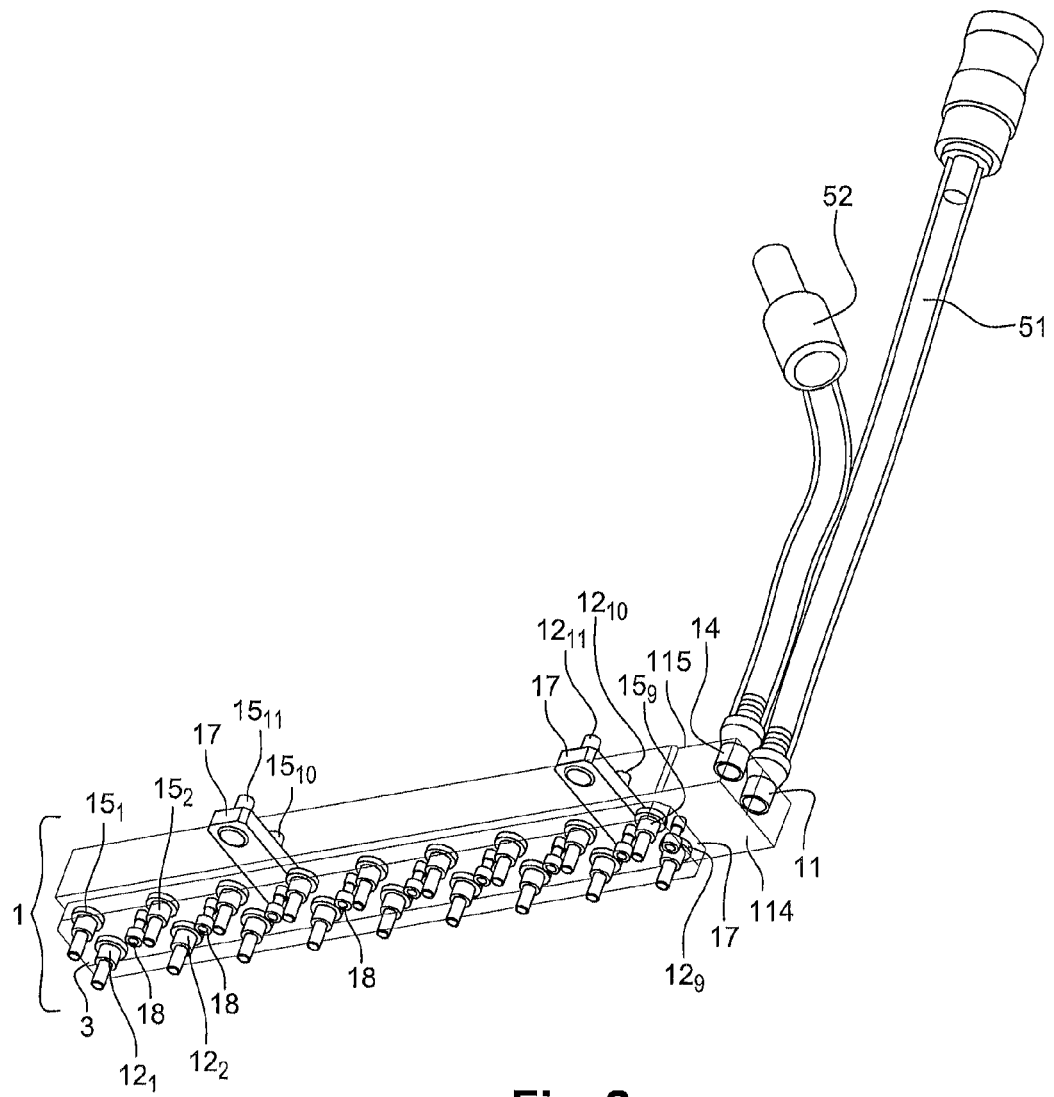
FIG. 2, a hydraulic distributor according to an embodiment of the invention.
Figure 3:
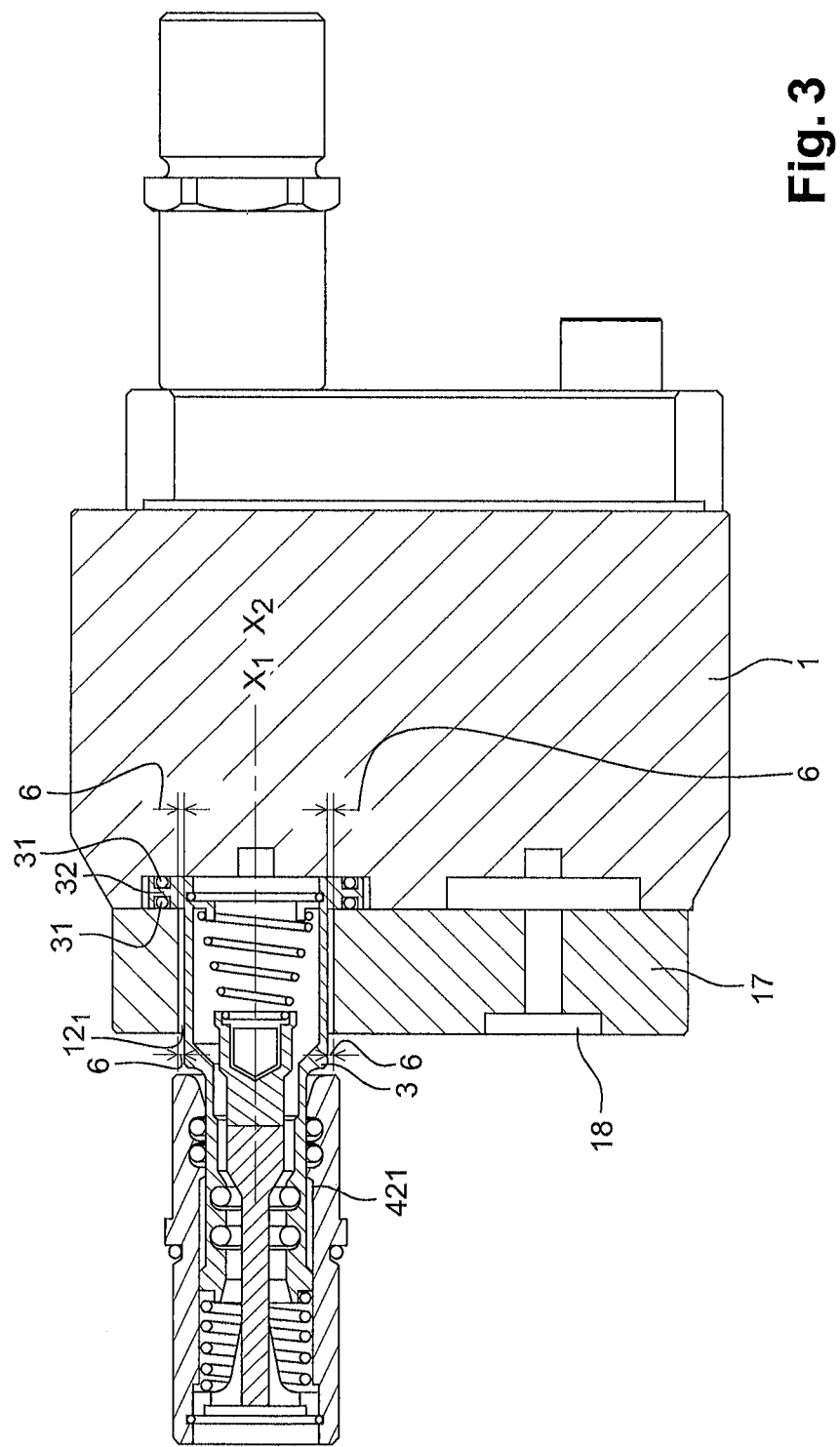
FIG. 3, a sectional view of a hydraulic distributor according to an embodiment of the invention and a floating connector.

In this example embodiment, the hydraulic distributor comprises twenty-two hydraulic connectors as can be seen in FIG. 2:
  eighteen hydraulic connectors on a second face 114 of the hydraulic distributor 1 to connected nine computer blades to the hydraulic distributor, the computer blades being connectable perpendicular to the distributor 1; and
  four hydraulic connectors on a third face 115 of the hydraulic distributor 1 to connect two so-called switch modules to the hydraulic distributor, to be coplanar with the distributor.

The eighteen hydraulic connectors on the second face 114 of the distributor 1 are distributed in nine supply conduits ($12_1, \ldots, 12_9$) and nine return conduits ($15_1, \ldots, 15_9$) so as to supply the nine plug-in computer blades with liquid coolant. The four hydraulic connectors of the third face 115 of the distributor 1 are distributed in two return conduits ($15_{10}, 15_{11}$) and two supply conduits ($12_{10}, 12_{11}$) so as to supply liquid coolant to the two switch modules.

The hydraulic distributor 1 comprises an inlet conduit 11 and an outlet conduit 14 so as to supply liquid coolant to the distributor 1, the inlet conduit 11 being connected to a liquid coolant supply pipe 51 and the outlet conduit 14 being connected to a liquid coolant outlet pipe 52. The liquid flow direction in the distributor has no specific influence on the cooling of devices that may be connected to the distributor 1.

The supply conduit $12_1$ and the return conduit $15_1$ are each fitted with a floating connector 3 so as to make blind connections of the supply conduit $12_1$ and return conduit $15_1$ for example to a computer blade cooling device, to which the hydraulic distributor 1 distributes a liquid coolant to cool the components of the computer blade in operation. The hydraulic distributor 1 comprises three retaining devices or retainers 17 consisting of plates that maintain pressure on the floating connectors 3 inserted in each of the supply conduits ($12_1, \ldots, 12_{11}$) and return conduits ($15_1, \ldots, 15_{11}$). These mechanical pressure retaining devices limit risks of leaks of the liquid coolant at the floating connectors. These plates 17 comprise one opening for each floating connector in the supply and return conduits of the hydraulic distributor to be held in contact by pressure. Once the plates 17 are in position, they may be fixed to the hydraulic distributor 1 by means of screw type attachment device or fastener 18 in order to fix the plates 17 in mechanical contact with the hydraulic distributor 1.

The hydraulic distributor supply and/or return conduits are arranged to assure that there is mechanical clearance between a first axis of the conduit and a second axis of the floating connector, so that a floating connector 3 can be inserted and thus a blind connection of the computer blades and their cooling device can be made in the rack of a computer cabinet. The mechanical clearance is particularly visible in FIG. 3. The hydraulic distributor 1 comprises a supply conduit $12_1$ at the end of which there is an orifice inside which a floating connector 3 is housed. The term floating connector 3 is used in this description, but it applies particularly to the male part of the connection, the female part being fixed on a computer blade. When it is inserted into the rack of a computer cabinet containing the hydraulic distributor 1, the computer blade is hydraulically connected to the cooling system of the computer cabinet. To achieve this, it has at least one computer blade connector 423, visible in section in FIG. 3. This computer blade connector 423 can be connected to the floating connector 3, that is itself connected to the supply conduit $12_1$ of the distributor. The dimensions of the supply conduit and its supply orifice are larger than the dimensions of the floating connector 3 so that there is a mechanical clearance 6 between a first axis X1 of the supply conduit and a second axis X2 of the floating connector, so as to obtain a degree of freedom during connection of the computer blade through the connection of the computer blade connector 423 at one end of the floating connector 3. This clearance results in a degree of flotation 6 between the external edges of the floating connector 3 and the internal edges of the supply conduit $12_1$. This mechanical clearance or degree of flotation can give a sufficient degree of freedom to recenter the hydraulic floating connector to the connection of the computer blade and its cooling device. Thus, if the floating connector is not perfectly facing the supply or return conduit to which it has to be connected, it can be recentered automatically because of the available mechanical clearance. The retaining device 17 to retain the floating connector 3 by pressure can limit the risks of a leak at the connection between the floating connector 3 and the supply conduit 121 by applying a pressure on the floating connector 3 and on the seal 31 of the floating connector located on each side of a shoulder 32 of the floating connector 3, thus guaranteeing flotation of the floating connector while maintaining a perfect seal by control over compression on the seal 31, for example a O-ring. The screw 18 is a device 18 to attach the retaining device 17 to the hydraulic distributor 1. A shoulder 32 is kept under pressure between the plate 17 and the face of the distributor 1 through seal 31.

Figure 4:
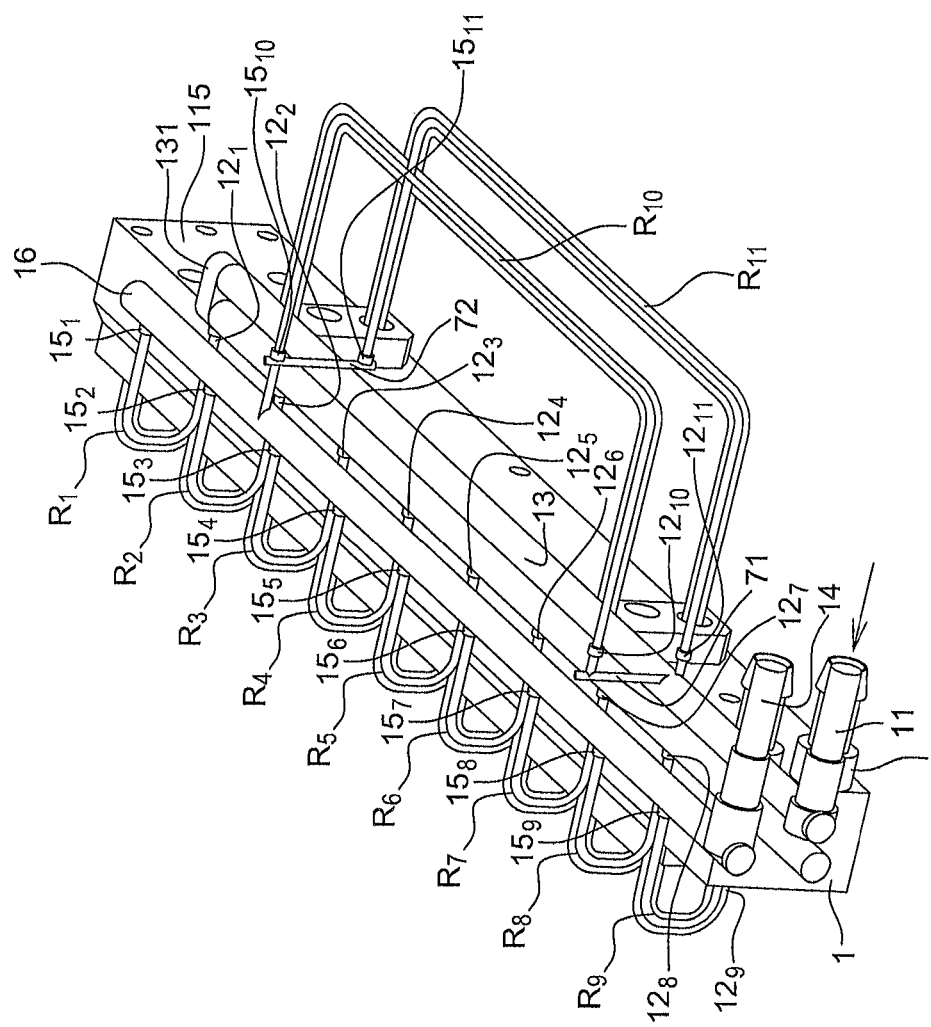
FIG. 4, a model of the hydraulic circuit through which a liquid coolant passes in a hydraulic distributor according to the embodiment in FIG. 2.

FIG. 4 shows a model of the hydraulic circuit through which the liquid coolant 2 passes to supply cooling devices (R1, ..., R9) for nine computer blades connected perpendicular to the distributor 1 and cooling devices (R10, R11) of two switch modules connected parallel to or coplanar with the distributor as described previously with reference to FIG. 2. The hydraulic distributor 1 comprises an inlet conduit 11 through which the liquid coolant arrives, located in the lower part of the distributor in this example embodiment, and an outlet conduit 14 through which the liquid coolant exits from the distributor after it has been distributed to the different cooling devices (R1, ..., R11).

Once the liquid coolant 2 has entered the hydraulic distributor 1 through the inlet conduit 11, it passes through a supply duct 13 that passes horizontally through the distributor 1. This supply duct 13 makes the hydraulic connection between the inlet conduit 11 and the eleven supply conduits ($12_1$, ..., $12_{11}$) to supply liquid coolant to the cooling devices (R1, ..., R11) that may be connected to the distributor 1.

Once the liquid coolant 2 has passed through the cooling devices (R1, ..., R11), it returns into the distributor 1 through eleven return conduits ($15_1$, ..., $15_{11}$), passes through the return duct 16 that passes horizontally through the distributor 1 and exits from the distributor through the outlet conduit 14.

In FIG. 4, it can clearly be seen that the cooling device R1 is the first device on the liquid coolant supply path through the supply duct 13 from the inlet conduit 11, but it is the last device on the liquid coolant return path through the return duct 16 from the outlet conduit 14: the supply system is of the LIFO last in/first out type. This supply system can give a constant pressure loss between the different cooling devices on the same side of the hydraulic distributor, and the path through which the liquid coolant passes is equivalent for the different cooling devices; thus, the liquid coolant flow passing through the different cooling devices is constant. This supply system balances liquid coolant flows between the different cooling devices connected to the hydraulic distributor. The baffle 131 of the supply duct generates this supply system despite the fact that the inlet conduit 11 and the return conduit 14 are located at the same end of the distributor.

The connection of the two cooling devices R10, R11 located on the third face 115 of the hydraulic distributor 1 that are horizontal requires an arrangement of the circuit. Because the nine cooling devices (R1, ..., R9) that cool the nine computer blades located on the second face 114 of the hydraulic distributor are perpendicular to the hydraulic distributor 1, the liquid coolant inlet into these cooling devices R1, ..., R9 faces the supply duct 13 and the liquid coolant outlet from these cooling devices R1, ... R9 faces the return duct 16. However, for the two horizontal cooling devices of the third face of the distributor, a crossover had to be made by forming additional internal drillings in the hydraulic conduits in order to supply these cooling devices. A first hydraulic division 71 is used to put the upper cooling device $R_{10}$ in hydraulic connection with the supply duct 13 that passes horizontally through the lower part of the hydraulic distributor and a second hydraulic division 72 puts the lower cooling device $R_{11}$ into hydraulic connection with the return duct 16 that passes horizontally through the upper part of the hydraulic distributor.

The diameter of the different supply conduits and return conduits may be different. Thus, the return conduit common to the cooling devices of the third face 115 of the distributor is located between the return conduits 152 of the second cooling device R2 and 153 of the third cooling device R3. This can create a pressure variation in the liquid coolant that is compensated by increasing the diameter of the return conduit of the third cooling device R3.

In the example embodiment in FIG. 4, the inlet conduit 11 and the outlet conduit 14 are located at the same end of the distributor, but they could also have been located at a different end of the distributor: the inlet conduit 11 at a first end of the distributor and the outlet conduit 14 at a second end of the distributor. In this case, there is no need for the supply duct 13 to have a baffle 131 to supply liquid coolant to cooling devices according to a last in/first out system (LIFO). Everything depends on the space available in the computer cabinet rack.

The distributor could have been composed of a first body and a second body, the first body comprising the liquid coolant supply part of cooling devices, namely the liquid coolant inlet conduit, the plurality of liquid coolant supply conduits to the devices and the supply, duct, and the second body comprising the liquid coolant return part from the cooling devices, namely the liquid coolant outlet conduit from the distributor, the plurality of liquid coolant return conduits and the return duct.

The invention is not limited to the embodiments described above with reference to the figures, and variants could be envisaged without going outside the scope of the invention.

The invention claimed is:

1. A hydraulic distributor capable of distributing a liquid coolant to a plurality of cooling devices, said distributor comprising:
    a liquid coolant inlet conduit to supply the liquid coolant into the distributor;
    a plurality of supply conduits to supply the liquid coolant to said cooling devices, each of the supply conduits being hydraulically connected to the inlet conduit through a supply duct;
    a liquid coolant outlet conduit to remove the liquid coolant from the distributor;
    a plurality of liquid coolant return conduits in the distributor, each of the return conduits being hydraulically connected to the outlet conduit by a return duct,
    wherein at least one of said liquid coolant supply and return conduits is adapted to be fitted with a floating connector allowing for a hydraulic connection with at least one of said plurality of cooling devices, wherein a mechanical clearance is provided between external edges of the floating connector and internal edges of the at least one of said liquid coolant supply and return conduits.

2. The hydraulic distributor according to claim 1, comprising a retaining device to apply pressure to the floating connector to maintain the floating connector in position relative to the at least one of said liquid coolant supply and return conduits.

3. The hydraulic distributor according to claim 2, comprising an attachment device to mechanically attach the retaining device to a main face of the hydraulic distributor.

4. The hydraulic distributor according to claim 3, wherein the attachment device is a screw.

5. The hydraulic distributor according to claim 2, wherein the retaining device is a plate.

6. The hydraulic distributor according to claim 1, wherein a first part of the plurality of liquid coolant supply conduits and the plurality of liquid coolant return conduits are arranged on a second face of the hydraulic distributor, and wherein a second part of the plurality of liquid coolant supply conduits and the plurality of liquid coolant return conduits are arranged on a third face of the hydraulic distributor.

7. The hydraulic distributor according to claim 6, wherein the supply conduit and the return conduit on a same face of the distributor have different diameters.

8. The hydraulic distributor according to claim 1, wherein the liquid coolant supply duct and the liquid coolant return duct are arranged relative to each other such that the supply of liquid coolant to the cooling devices follows a last in/first out (LIFO) type system.

9. The hydraulic distributor according to claim 1, wherein the supply duct and the return duct pass through the distributor horizontally, wherein the inlet conduit and the return conduit are located at a same end of the distributor and wherein the supply duct comprises a baffle.

10. The hydraulic distributor according to claim 1, wherein the supply duct and the return duct pass through the distributor horizontally, wherein the distributor comprises a first end and second end, the inlet conduit being located at the first end of the distributor and the outlet conduit being located at the second end of the distributor.

11. The hydraulic distributor according to claim 1, wherein the plurality of liquid coolant supply conduits and the plurality of liquid coolant return conduits are arranged on a first face of the hydraulic distributor.

12. The hydraulic distributor according to claim 1, wherein the hydraulic distributor is composed of two bodies, a first body comprising the liquid coolant inlet conduit, the plurality of liquid coolant supply conduits of said cooling devices and the supply duct, and a second body comprising the liquid coolant outlet conduit from the distributor, the plurality of liquid coolant return conduits and the return duct.

13. A computer cabinet rack comprising a hydraulic distributor according to claim 1.

14. A hydraulic distributor capable of distributing a liquid coolant to a plurality of cooling devices, said distributor comprising:
   a liquid coolant inlet conduit to supply the liquid coolant into the distributor;
   a plurality of supply conduits to supply the liquid coolant to said cooling devices, each of the supply conduits being hydraulically connected to the inlet conduit through a supply duct;
   a liquid coolant outlet conduit to remove the liquid coolant from the distributor;
   a plurality of liquid coolant return conduits to supply the liquid coolant in the distributor after the liquid coolant has passed through the cooling devices, each of the return conduits being hydraulically connected to the outlet conduit by a return duct;
   a floating connector having at least a portion thereof received in an orifice formed by one of said liquid coolant supply and return conduits, the at least portion of the floating connector maintained in said orifice with a retaining device, the floating connector permitting a hydraulic connection with at least one of said plurality of cooling devices,
   wherein a cross section of the orifice, taken perpendicular to a longitudinal direction of the orifice, is larger than a cross-section of the at least portion of the floating connector, taken perpendicular to a longitudinal direction of the floating connector, to enable a mechanical clearance between the at least portion of the floating connector and the orifice along the longitudinal direction of the orifice.

15. The hydraulic distributor according to claim 14, wherein the retaining device is a plate.

16. The hydraulic distributor according to claim 15, wherein the retaining device is attached to a face of the hydraulic distributor with a screw.

17. The hydraulic distributor according to claim 14, wherein the liquid coolant supply duct and the liquid coolant return duct are arranged relative to each other such that the supply of liquid coolant to the cooling devices follows a last in/first out (LIFO) type system.

18. The hydraulic distributor according to claim 14, wherein the supply duct and the return duct pass through the distributor horizontally, wherein the inlet conduit and the return conduit are located at a same end of the distributor and wherein the supply duct comprises a baffle.

19. The hydraulic distributor according to claim 14, wherein the supply duct and the return duct pass through the distributor horizontally, wherein the distributor comprises a first end and second end, the inlet conduit being located at the first end of the distributor and the outlet conduit being located at the second end of the distributor.

20. A computer cabinet rack comprising a hydraulic distributor according to claim 14.

\* \* \* \* \*